United States Patent
Stanke et al.

(10) Patent No.: US 7,446,888 B2
(45) Date of Patent: *Nov. 4, 2008

(54) MATCHING OPTICAL METROLOGY TOOLS USING DIFFRACTION SIGNALS

(75) Inventors: Fred Stanke, San Jose, CA (US); Holger Tuitje, Fremont, CA (US); Shigeru Nagano, Campbell, CA (US)

(73) Assignee: Tokyo Electron Limited, Tokyo (JP)

(*) Notice: Subject to any disclaimer, the term of this patent is extended or adjusted under 35 U.S.C. 154(b) by 200 days.

This patent is subject to a terminal disclaimer.

(21) Appl. No.: 11/438,806

(22) Filed: May 22, 2006

(65) Prior Publication Data

US 2007/0268498 A1  Nov. 22, 2007

(51) Int. Cl.
G01B 11/14 (2006.01)
G01B 11/00 (2006.01)

(52) U.S. Cl. ................ 356/625; 356/388
(58) Field of Classification Search ........... 356/625, 356/388

See application file for complete search history.

(56) References Cited

U.S. PATENT DOCUMENTS

| | | | |
|---|---|---|---|
| 6,317,211 B1 * | 11/2001 | Ausschnitt et al. | 356/401 |
| 6,660,542 B1 * | 12/2003 | Stirton | 438/16 |
| 6,785,638 B2 | 8/2004 | Niu et al. | |
| 6,891,626 B2 | 5/2005 | Niu | |
| 6,943,900 B2 | 9/2005 | Niu et al. | |
| 2003/0076511 A1 * | 4/2003 | Aikens et al. | 356/636 |
| 2004/0267397 A1 | 12/2004 | Doddi et al. | |

OTHER PUBLICATIONS

Ll, Lifeng (May 1996) "Formulation and comparisonn of two recursive matrix algorithms for modeling layered diffraction gratings," *J. Opt. Soc. Am. A*, 13(5): 1024-1035.

Ll, Lifeng (Oct. 1997) "New formulation of the Fourier modal method for crossed surface-relief gratings," *J. Opt. Soc. A. A*, 14(10): 2758-2767.

Stanke, Fred et al., pending non-published U.S. Appl. No. 11/438,776, filed May 22, 2006.

Ausschnitt, C.P., (Feb. 23, 2004) "A New Approach to Pattern Metrology," *Proc. SPIE*, 5375: 51-65.

Haykin, S., (1999) *Neural Networks*, Prentice Hall.

Ll, L., (1996) "Formulation and comparison of two recursive matrix algorithms for modeling layered diffraction gratings," *J. Opt. Soc. Am.* A13:1024-1035.

* cited by examiner

*Primary Examiner*—Roy M Punnoose
(74) *Attorney, Agent, or Firm*—Morrison & Foerster LLP

(57) ABSTRACT

Optical metrology tools in a fleet of optical metrology tools can be matched using transforms. In particular, a first set of measured diffraction signals is obtained. The first set of measured diffraction signals was measured using a first optical metrology tool from the fleet of optical metrology tools. A second set of measured diffraction signals is obtained. The second set of diffraction signals was measured using a second optical metrology tool from the fleet of optical metrology tools. A reference diffraction signal is obtained. A first transform is generated based on the first set of measured diffraction signals and the reference diffraction signal. A second transform is generated based on the second set of measured diffraction signals and the reference diffraction signal.

25 Claims, 6 Drawing Sheets

MATCHING OPTICAL METROLOGY TOOLS USING DIFFRACTION SIGNALS

BACKGROUND

1. Field

The present application generally relates to optical metrology, and, more particularly, matching a plurality of optical metrology tools used for determining the profile of a structure formed on a semiconductor wafer.

2. Description of the Related Art

Optical metrology involves directing an incident beam at a structure, measuring the resulting diffracted beam, and analyzing the diffracted beam to determine a feature of the structure. In semiconductor manufacturing, optical metrology is typically used for quality assurance. For example, after fabricating a structure on a semi-conductor wafer an optical metrology tool is used to determine the profile of the structure. By determining the profile of the structure, the quality of the fabrication process utilized to form the structure can be evaluated.

As a result of the broad adoption of optical metrology, one fabrication facility or site where microelectronics are manufactured typically has multiple optical metrology tools in a fleet whose results are used somewhat interchangeably. In these cases, it is desirable that the instruments in the fleet match one another. In the ideal case, if the instruments were identical, their measurements would match to some uncertainty determined by measurement noise. However, optical metrology tools show deterministic differences, where the difference between the measurements is greater than the uncertainties of the measurement. One approach to improve matching is to carefully calibrate the tools, so that the optical characteristics measured by tools are as similar as possible, even if the details of each of the tools construction dictate that the detected intensities on the same sample are different. In some sense, this is the goal of calibration.

Calibration is typically done with calibration structures, with the intention that the calibration will remain valid for measurements on various application structures. Often calibration structures are one or more thicknesses of an oxide on a silicon substrate. Application structures can be very different than these simple calibration structures. In a fabrication facility, one application structure can be resist on top of a stack of layers for the formation of transistor gates after it has been exposed and developed, in order to examine the effects of adjusting, e.g., focus and dose on the exposure tool. Another application structure can be shallow isolation trenches in a silicon substrate. In general, the optical characteristics of these application structures can be substantially different from one another, and from the optical characteristics employed in calibration, which is ideally intended to be valid for all structures.

However, even after the optical metrology tools in a fleet have been calibrated, their optical characteristics, and subsequently their fit parameters, can differ. Such differences can be an issue for the control of processes in the fabrication facility. Accordingly, it is desirable to compensate for variations in the optical characteristics of optical metrology tools for a given application.

SUMMARY

In one exemplary embodiment, optical metrology tools in a fleet of optical metrology tools can be matched using transforms. In particular, a first set of measured diffraction signals is obtained. The first set of measured diffraction signals was measured using a first optical metrology tool from the fleet of optical metrology tools. A second set of measured diffraction signals is obtained. The second set of diffraction signals was measured using a second optical metrology tool from the fleet of optical metrology tools. A reference diffraction signal is obtained. A first transform is generated based on the first set of measured diffraction signals and the reference diffraction signal. A second transform is generated based on the second set of measured diffraction signals and the reference diffraction signal.

DESCRIPTION OF THE DRAWING FIGURES

The present application can be best understood by reference to the following description taken in conjunction with the accompanying drawing figures, in which like parts may be referred to by like numerals:

DETAILED DESCRIPTION

The following description sets forth numerous specific configurations, parameters, and the like. It should be recognized, however, that such description is not intended as a limitation on the scope of the present invention, but is instead provided as a description of exemplary embodiments.

1. Optical Metrology Tools

Figure 1:
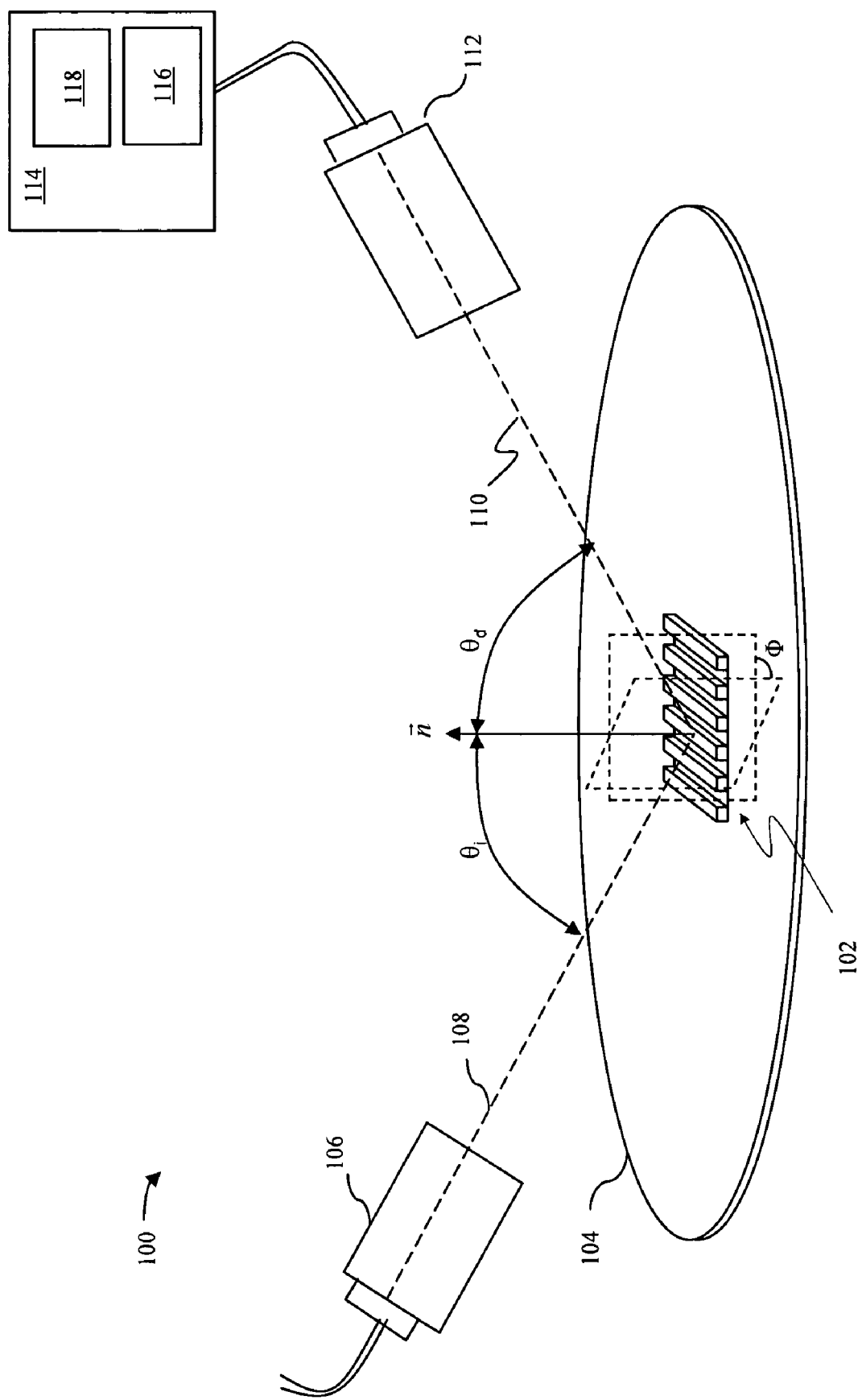
FIG. 1 depicts an exemplary optical metrology system.

With reference to FIG. 1, an optical metrology system 100 can be used to examine and analyze a structure formed on a semiconductor wafer 104. For example, optical metrology system 100 can be used to determine one or more features of a periodic grating 102 formed on wafer 104. As described earlier, periodic grating 102 can be formed in a test pad on wafer 104, such as adjacent to a die formed on wafer 104. Periodic grating 102 can be formed in a scribe line and/or an area of the die that does not interfere with the operation of the die.

As depicted in FIG. 1, optical metrology system 100 can include a photometric device with a source 106 and a detector 112. Periodic grating 102 is illuminated by an incident beam 108 from source 106. The incident beam 108 is directed onto periodic grating 102 at an angle of incidence $\theta_i$ with respect to normal $\bar{n}$ of periodic grating 102 and an azimuth angle $\Phi$ (i.e., the angle between the plane of incidence beam 108 and the direction of the periodicity of periodic grating 102). Diffracted beam 110 leaves at an angle of $\theta_d$ with respect to normal and is received by detector 112. Detector 112 converts the diffracted beam 110 into a measured diffraction signal, which can include reflectance, $\tan(\Psi)$, $\cos(\Delta)$, Fourier coefficients, and the like. Although a zero-order diffraction signal is depicted in FIG. 1, it should be recognized that non-zero orders can also be used. For example, see Ausschnitt, Christopher P., "A New Approach to Pattern Metrology," Proc. SPIE 5375-7, Feb. 23, 2004, pp 1-15, which is incorporated herein by reference in its entirety.

Optical metrology system 100 also includes a processing module 114 configured to receive the measured diffraction signal and analyze the measured diffraction signal. The processing module is configured to determine one or more features of the periodic grating using any number of methods which provide a best matching diffraction signal to the measured diffraction signal. These methods have been described elsewhere and include a library-based process, or a regression based process using simulated diffraction signals obtained by rigorous coupled wave analysis and machine learning systems.

2. Library-Based Process of Determining Feature of Structure

In a library-based process of determining one or more features of a structure, the measured diffraction signal is compared to a library of simulated diffraction signals. More specifically, each simulated diffraction signal in the library is associated with a hypothetical profile of the structure. When a match is made between the measured diffraction signal and one of the simulated diffraction signals in the library or when the difference of the measured diffraction signal and one of the simulated diffraction signals is within a preset or matching criterion, the hypothetical profile associated with the matching simulated diffraction signal is presumed to represent the actual profile of the structure. The matching simulated diffraction signal and/or hypothetical profile can then be utilized to determine whether the structure has been fabricated according to specifications.

Thus, with reference again to FIG. 1, in one exemplary embodiment, after obtaining a measured diffraction signal, processing module 114 then compares the measured diffraction signal to simulated diffraction signals stored in a library 116. Each simulated diffraction signal in library 116 can be associated with a hypothetical profile. Thus, when a match is made between the measured diffraction signal and one of the simulated diffraction signals in library 116, the hypothetical profile associated with the matching simulated diffraction signal can be presumed to represent the actual profile of periodic grating 102.

The set of hypothetical profiles stored in library 116 can be generated by characterizing a hypothetical profile model using a set of profile parameters, then varying the set of profile parameters to generate hypothetical profiles of varying shapes and dimensions. The process of characterizing a profile using a set of profile parameters can be referred to as parameterizing.

Figure 2E:
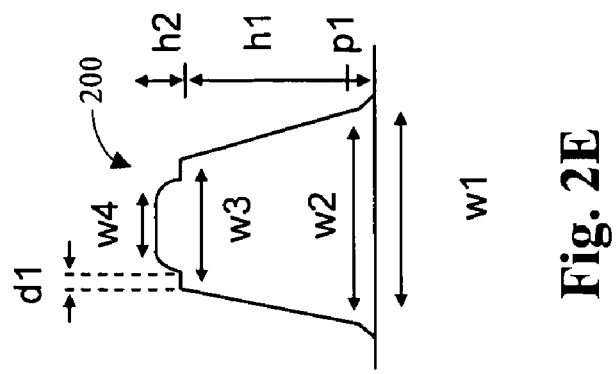
FIGS. 2A-2E depict exemplary hypothetical profiles.
Figure 2C:
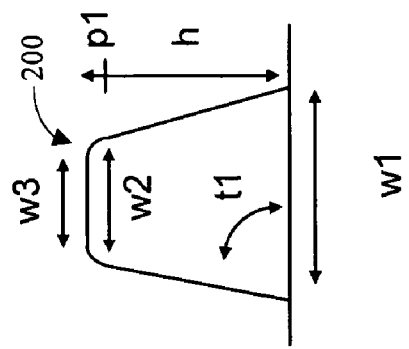
Figure 2D:
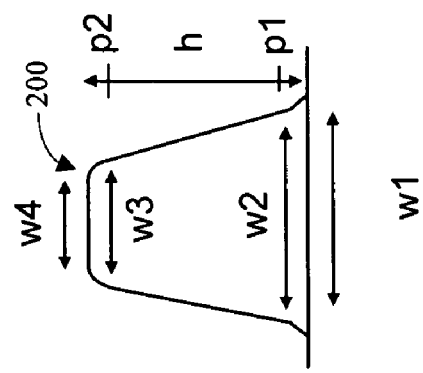
Figure 2A:
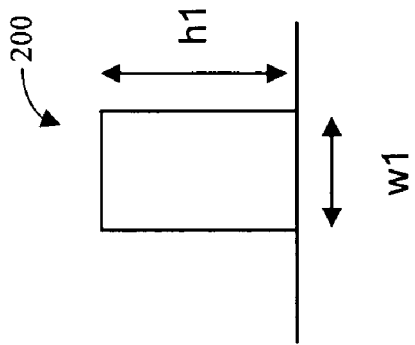
Figure 2B:
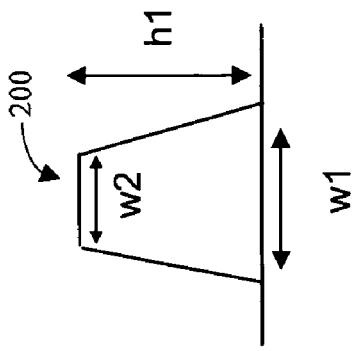

For example, as depicted in FIG. 2A, assume that hypothetical profile 200 can be characterized by profile parameters h1 and w1 that define its height and width, respectively. As depicted in FIGS. 2B to 2E, additional shapes and features of hypothetical profile 200 can be characterized by increasing the number of profile parameters. For example, as depicted in FIG. 2B, hypothetical profile 200 can be characterized by profile parameters h1, w1, and w2 that define its height, bottom width, and top width, respectively. Note that the width of hypothetical profile 200 can be referred to as the critical dimension (CD). For example, in FIG. 2B, profile parameter w1 and w2 can be described as defining the bottom CD (BCD) and top CD (TCD), respectively, of hypothetical profile 200.

As described above, the set of hypothetical profiles stored in library 116 (FIG. 1) can be generated by varying the profile parameters that characterize the hypothetical profile model. For example, with reference to FIG. 2B, by varying profile parameters h1, w1, and w2, hypothetical profiles of varying shapes and dimensions can be generated. Note that one, two, or all three profile parameters can be varied relative to one another.

With reference again to FIG. 1, the number of hypothetical profiles and corresponding simulated diffraction signals in the set of hypothetical profiles and simulated diffraction signals stored in library 116 (i.e., the resolution and/or range of library 116) depends, in part, on the range over which the set of profile parameters and the increment at which the set of profile parameters are varied. The hypothetical profiles and the simulated diffraction signals stored in library 116 are generated prior to obtaining a measured diffraction signal from an actual structure. Thus, the range and increment (i.e., the range and resolution) used in generating library 116 can be selected based on familiarity with the fabrication process for a structure and what the range of variance is likely to be. The range and/or resolution of library 116 can also be selected based on empirical measures, such as measurements using AFM, X-SEM, and the like.

For a more detailed description of a library-based process, see U.S. patent application Ser. No. 09/907,488, titled GENERATION OF A LIBRARY OF PERIODIC GRATING DIFFRACTION SIGNALS, filed on Jul. 16, 2001, which is incorporated herein by reference in its entirety.

3. Regression-Based Process of Determining Feature of Structure

In a regression-based process of determining one or more features of a structure, the measured diffraction signal is compared to a simulated diffraction signal (i.e., a trial diffraction signal). The simulated diffraction signal is generated prior to the comparison using a set of profile parameters (i.e., trial profile parameters) for a hypothetical profile. If the measured diffraction signal and the simulated diffraction signal do not match or when the difference of the measured diffraction signal and one of the simulated diffraction signals is not within a preset or matching criterion, another simulated diffraction signal is generated using another set of profile parameters for another hypothetical profile, then the measured diffraction signal and the newly generated simulated diffraction signal are compared. When the measured diffraction signal and the simulated diffraction signal match or when the difference of the measured diffraction signal and one of the simulated diffraction signals is within a preset or matching criterion, the hypothetical profile associated with the matching simulated diffraction signal is presumed to represent the actual profile of the structure. The matching simulated diffraction signal and/or hypothetical profile can then be utilized to determine whether the structure has been fabricated according to specifications.

Thus, with reference again to FIG. 1, the processing module 114 can generate a simulated diffraction signal for a hypothetical profile, and then compare the measured diffraction signal to the simulated diffraction signal. As described above, if the measured diffraction signal and the simulated diffraction signal do not match or when the difference of the measured diffraction signal and one of the simulated diffraction signals is not within a preset or matching criterion, then processing module 114 can iteratively generate another simulated diffraction signal for another hypothetical profile. The subsequently generated simulated diffraction signal can be generated using an optimization algorithm, such as global optimization techniques, which includes simulated annealing, and local optimization techniques, which includes steepest descent algorithm.

The simulated diffraction signals and hypothetical profiles can be stored in a library 116 (i.e., a dynamic library). The simulated diffraction signals and hypothetical profiles stored in library 116 can then be subsequently used in matching the measured diffraction signal.

For a more detailed description of a regression-based process, see U.S. patent application Ser. No. 09/923,578, titled METHOD AND SYSTEM OF DYNAMIC LEARNING THROUGH A REGRESSION-BASED LIBRARY GENERATION PROCESS, filed on Aug. 6, 2001, which is incorporated herein by reference in its entirety.

4. Rigorous Coupled Wave Analysis

As described above, simulated diffraction signals are generated to be compared to measured diffraction signals. As will be described below the simulated diffraction signals can be generated by applying Maxwell's equations and using a numerical analysis technique to solve Maxwell's equations. It should be noted, however, that various numerical analysis techniques, including variations of RCWA, can be used.

In general, RCWA involves dividing a hypothetical profile into a number of sections, slices, or slabs (hereafter simply referred to as sections). For each section of the hypothetical profile, a system of coupled differential equations generated using a Fourier expansion of Maxwell's equations (i.e., the components of the electromagnetic field and permittivity ($\epsilon$)). The system of differential equations is then solved using a diagonalization procedure that involves eigenvalue and eigenvector decomposition (i.e., Eigen-decomposition) of the characteristic matrix of the related differential equation system. Finally, the solutions for each section of the hypothetical profile are coupled using a recursive-coupling schema, such as a scattering matrix approach. For a description of a scattering matrix approach, see Lifeng Li, "Formulation and comparison of two recursive matrix algorithms for modeling layered diffraction gratings," J. Opt. Soc. Am. A13, pp 1024-1035 (1996), which is incorporated herein by reference in its entirety. For a more detail description of RCWA, see U.S. patent application Ser. No. 09/770,997, titled CACHING OF INTRA-LAYER CALCULATIONS FOR RAPID RIGOROUS COUPLED-WAVE ANALYSES, filed on Jan. 25, 2001, which is incorporated herein by reference in its entirety.

5. Machine Learning Systems

The simulated diffraction signals can be generated using a machine learning system (MLS) employing a machine learning algorithm, such as back-propagation, radial basis function, support vector, kernel regression, and the like. For a more detailed description of machine learning systems and algorithms, see "Neural Networks" by Simon Haykin, Prentice Hall, 1999, which is incorporated herein by reference in its entirety. See also U.S. patent application Ser. No. 10/608,300, titled OPTICAL METROLOGY OF STRUCTURES FORMED ON SEMICONDUCTOR WAFERS USING MACHINE LEARNING SYSTEMS, filed on Jun. 27, 2003, which is incorporated herein by reference in its entirety.

In one exemplary embodiment, the simulated diffraction signals in a library of diffraction signals, such as library 116 (FIG. 1), used in a library-based process are generated using a MLS. For example, a set of hypothetical profiles can be provided as inputs to the MLS to produce a set of simulated diffraction signals as outputs from the MLS. The set of hypothetical profiles and set of simulated diffraction signals are stored in the library.

In another exemplary embodiment, the simulated diffractions used in regression-based process are generated using a MLS, such as MLS 118 (FIG. 1). For example, an initial hypothetical profile can be provided as an input to the MLS to produce an initial simulated diffraction signal as an output from the MLS. If the initial simulated diffraction signal does not match the measured diffraction signal, another hypothetical profile can be provided as an additional input to the MLS to produce another simulated diffraction signal.

FIG. 1 depicts processing module 114 having both a library 116 and MLS 118. It should be recognized, however, that processing module 114 can have either library 116 or MLS 118 rather than both. For example, if processing module 114 only uses a library-based process, MLS 118 can be omitted. Alternatively, if processing module 114 only uses a regression-based process, library 116 can be omitted. Note, however, a regression-based process can include storing hypothetical profiles and simulated diffraction signals generated during the regression process in a library, such as library 116.

6. Matching Optical Metrology Tools

As described above, optical metrology tools in a fleet can be calibrated. However, even after calibration, variations in optical characteristics of the optical metrology tools in the fleet can produce variations in the results obtained using the optical metrology tools.

Thus, in one exemplary embodiment, the optical metrology tools in the fleet are matched using transforms. In particular, with reference to FIG. 3, an exemplary process 300 is depicted of matching optical metrology tools in a fleet of optical metrology tools using transforms of hypothetical profiles.

In step 302, a plurality of hypothetical profiles of one or more structures is obtained. The hypothetical profiles obtained in step 302 were determined based on measured diffraction signals measured using the optical metrology tools in the fleet. In particular, a plurality of measured diffraction signals are measured off the one or more structures using the optical metrology tools in the fleet. As described above, best matching hypothetical profiles of the measured diffraction signals can be determined using a library-based process or a regression-based process. The hypothetical profiles obtained in step 302 are the best matching hypothetical profiles of the measured diffraction signals.

Figure 4:
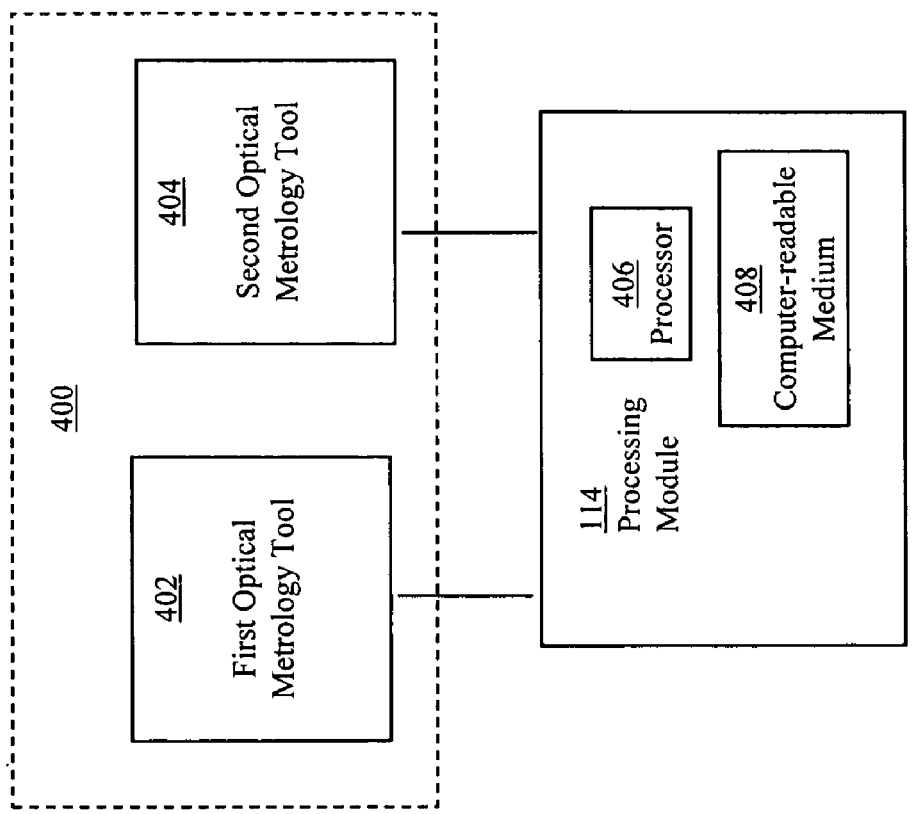
FIG. 4 depicts an exemplary fleet of optical metrology tools.

For example, FIG. 4 depicts an exemplary fleet 400 having a first optical metrology tool 402 and a second optical metrology tool 404. A first set of measured diffraction signals is measured using first optical metrology tool 402. A second set of measured diffraction signals is measured using second optical metrology tool 404. A first set of hypothetical profiles is determined as the best matching hypothetical profiles for the first set of measured diffraction signals. A second set of hypothetical profiles is determined as the best matching hypothetical profiles for the second set of measured diffraction signals. As also depicted in FIG. 4, processing module 114 can obtain the first and second sets of hypothetical profiles determined using first optical metrology tool 402 and second optical metrology tool 404, respectively. It should be recognized that fleet 400 can include any number of optical metrology tools, and any number of hypothetical profiles can be obtained from any number of optical metrology tools.

With reference again to FIG. 3, in step 304, a reference profile is obtained. In one exemplary embodiment, one of the optical metrology tools in the fleet can be selected as a reference tool. The hypothetical profile obtained from the reference tool can then be selected as the reference profile. In another exemplary embodiment, the reference profile can be obtained from measurements by a metrology tool that is not an optical metrology tool, such as CDs measured using a CD scanning electron microscopy. In another exemplary embodiment, the reference profile can be obtained by averaging the hypothetical profiles obtained in step 302.

For example, with reference again to FIG. 4, assume the hypothetical profiles in the first set of hypothetical profiles determined by first optical metrology tool 402 are defined by profile parameters $h_1$ and $w_1$. Assume also that the hypothetical profiles in the second set of hypothetical profiles determined by second optical metrology tool 404 are defined by profile parameters $h_2$ and $w_2$. In the present example, the reference profiles can be obtained by averaging the profile parameters of the first and second sets of hypothetical profiles. In particular, a reference height $h_r$ of the reference profile can be obtained by averaging $h_1$ and $h_2$. A reference width $w_r$ of the reference profile can be obtained by averaging $w_1$ and $w_2$.

With reference again to FIG. 3, in step 306, a plurality of transforms is generated based on the plurality of hypothetical profiles obtained in step 302 and the reference profile obtained in step 304. For example, with reference to FIG. 4, a first transform can be generated based on the first set of hypothetical profiles, which was determined using first optical metrology tool 402, and the reference profile. A second transform can be generated based on the second set of hypothetical profiles, which was determined using second optical metrology tool 404, and the reference profile.

With reference again to FIG. 3, in one exemplary embodiment, each transform generated in step 306 defines a mathematical relationship between one of the plurality of hypothetical profiles obtained in step 302 and the reference profile. The mathematical relationship can be a constant that scales the values of the profile parameters of the hypothetical profiles obtained in step 302 to the values of the corresponding profile parameters of the reference profile. In another exemplary embodiment, the values of the profile parameters of the reference profile can be a linear combination of the values of multiple profiles parameters of the hypothetical profiles obtained in step 302.

For example, with reference again to FIG. 4, assume that the hypothetical profiles of the first set of hypothetical profiles are defined by profile parameters $h_1$ and $w_1$. Assume also that the hypothetical profiles of the second set of hypothetical profiles are defined by profile parameters $h_2$ and $w_2$. For the exemplary embodiment when the mathematical relationship is scaling by constants (one for each parameter), profile parameters $h_1$ and $w_1$ can be transformed into transformed hypothetical profile parameters $h'_{r1}$ and $w'_{r1}$ by multiplying $h_1$ and $w_1$ by constants (i.e. $h'_{r1}=t_{h1} \times h_1$ and $w'_{r1}=t_{w1} \times w_1$), where $t_{h1}$ is the constant which transforms $h_1$ and is obtained by $h_r/h_1$, and $t_{w1}$ is the constant which transforms $w_1$ and is obtained by dividing $w_r/w_1$. For this example, the profile parameters $h_2$ and $w_2$ would also have a set of constants $t_{h2}$ and $t_{w2}$ that transforms them, respectively, into the transformed hypothetical profile parameters $h'_{r2}$ and $w'_{r2}$.

For the exemplary embodiment when the mathematical relationship is a linear combination, the transformed profile parameters can be defined as a linear combination of the hypothetical profile parameter values $h_1$ and $w_1$ (i.e. $h'_{r1}=t_{h11} \times h_1+t_{h12} \times w_1$ and $w_{r1}=t_{w11} \times w_1+t_{w12} \times h_1$) and $h_2$ and $w_2$ (i.e. $h'_{r2}=t_{h21} \times h_2+t_{h22} \times w_2$ and $w_{r2}=t_{w21} \times w_2+t_{w22} \times h_2$). In this example, the transform is a matrix $$\begin{bmatrix} t_{h^*1} & t_{h^*2} \\ t_{w^*1} & t_{w^*2} \end{bmatrix}$$

and operates on the vector $$\begin{bmatrix} h_* \\ w_* \end{bmatrix}$$

to obtain the vector $$\begin{bmatrix} h'_{r^*} \\ w'_{r^*} \end{bmatrix},$$

where * is either a 1 or a 2 and represents first optical metrology tool 402 or second metrology tool 404, respectively. The transform $$\begin{bmatrix} t_{h^*1} & t_{h^*2} \\ t_{w^*1} & t_{w^*2} \end{bmatrix}$$

can be calculated using standard linear algebra techniques. Additionally, other methods such as the pseudo inverse of matrices method can be used to calculate the transform as will be discussed below.

With reference again to FIG. 3, in step 308, a plurality of hypothetical profiles is obtained. Similar to the hypothetical profiles obtained in step 302, the hypothetical profiles obtained in step 308 were determined based on measured diffraction signals measured using the optical metrology tools in the fleet. For example, with reference again to FIG. 4, a first hypothetical profile, which was determined using first optical metrology tool 402, can be obtained. A second hypothetical profile, which was determined using second optical metrology tool 404, can be obtained.

It should be recognized that the plurality of hypothetical profiles obtained in step 308 can be a subset or the same as the plurality of hypothetical profiles obtained in step 302. For example, the first hypothetical profile can be one of the hypothetical profiles in the first set of hypothetical profiles obtained in step 302. Similarly, the second hypothetical profile can be one of the hypothetical profiles in the second set of hypothetical profiles obtained in step 302.

Alternatively, the plurality of hypothetical profiles obtained in step 308 can be different than the plurality of hypothetical profiles obtained in step 302. For example, the first hypothetical profile can be different than the hypothetical profiles in the first set of hypothetical profiles obtained in step 302. Similarly, the second hypothetical profile can be different than the hypothetical profiles in the second set of hypothetical profiles obtained in step 302.

With reference again to FIG. 3, in step 310, the plurality of hypothetical profiles obtained in step 308 is transformed into a plurality of transformed hypothetical profiles using the plurality of transforms generated in step 306. For example, with reference again to FIG. 4, the first hypothetical profile, which was determined using first optical metrology tool 402, can be transformed into a first transformed hypothetical profile using the first transform. The second hypothetical profile, which was determined using second optical metrology tool 404, can be transformed into a second transformed hypothetical profile using the second transform.

With reference again to FIG. 3, it should be recognized that process 300 can include any number of intervening steps. For example, in one exemplary embodiment, after the plurality of transforms is generated in step 306, the transforms can be stored, for example on a computer-readable medium. Additionally, associations between the transforms and the optical metrology tools can be stored with the plurality of transforms.

For example, with reference again to FIG. 4, the first and second transforms can be stored in a computer-readable storage medium 408 (e.g., memory, hard disk, etc.) on processing module 114 or connected to processing module 114. Additionally, an association between the first transform and first optical metrology tool 402 can be stored with the first transform. Similarly, an association between the second transform and second optical metrology tool 404 can be stored with the second transform. For example, the first and second transforms and the associations can be stored as part of a library.

With reference again to FIG. 3, when the plurality of transforms generated in step 306 is stored, the stored transforms can be first retrieved before being used in steps 310. Additionally, the stored transforms can be retrieved based on the association between the transforms and the optical metrology tools.

For example, with reference again to FIG. 4, the first and second transforms can be retrieved from computer-readable medium 408. Additionally, the first transform can be retrieved from computer-readable medium 408 based on an association between the first transform and first optical metrology tool 402. Similarly, the second transform can be retrieved from computer-readable medium 408 based on an association between the second transform and second optical metrology tool 404.

With reference again to FIG. 3, in one exemplary embodiment, the transforms generated in step 306 can be associated with a particular application, where an application defines one or more fabrication processes and process parameters used to fabricate the one or more structures. The association of the transforms and the application is stored with the transforms.

Figure 3:
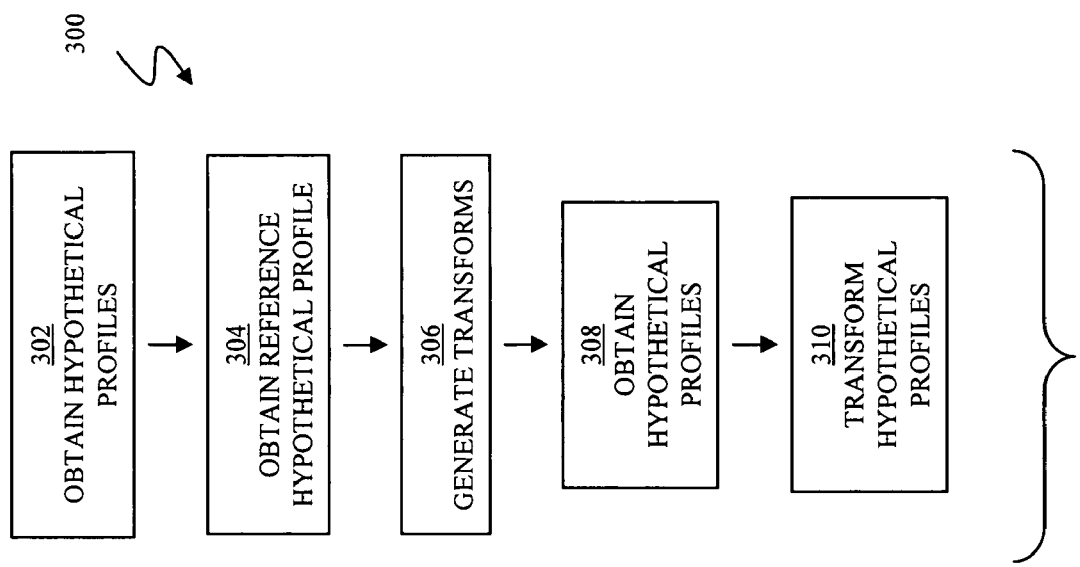
FIG. 3 depicts an exemplary process of matching optical metrology tools.

Although process 300 is depicted in FIG. 3 as a continuous process, it should be recognized that sets of steps in process 300 can be performed separately. For example, steps 302-306 can be performed separately from steps 308 and 310. Thus, steps 302-306 are performed to generate transforms, which can then be stored with the associations of the transforms and the optical metrology tools and/or application. Steps 308 and 310 can be performed separately from steps 302-306 to retrieve the transforms and to use the stored transforms to transform subsequently obtained hypothetical profiles determined by the optical metrology tools in the fleet. The appropriate stored transforms can be retrieved based on the stored associations of the transforms and the optical metrology tools and/or application.

As depicted in FIG. 4, processing module 114 can include a processor 406 that is configured to control and operate processing module 114. In particular, processor 406 can be configured to perform the steps of exemplary process 300 (FIG. 3). It should be recognized, however, that processor 406 can be implemented as a number of hardware components or combination of hardware and software components.

Figure 5:
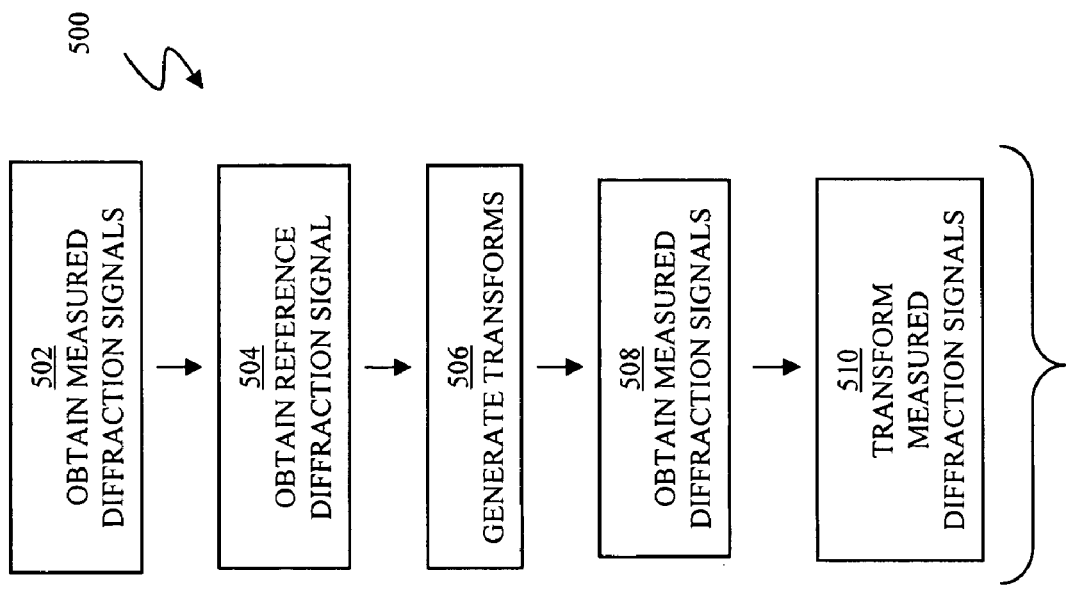
FIG. 5 depicts another exemplary process of matching optical metrology tools.

With reference to FIG. 5, an exemplary process 500 is depicted of matching optical metrology tools in a fleet of optical metrology tools using transforms of measured diffraction signals.

In step 502, a plurality of measured diffraction signals are obtained. The measured diffraction signals obtained in step 502 were measured off one or more structures using the optical metrology tools in the fleet. For example, with reference to FIG. 4, a first set of measured diffraction signals is measured using first optical metrology tool 402. A second set of measured diffraction signals is measured using second optical metrology tool 404.

With reference again to FIG. 5, in step 504, a reference diffraction signal is obtained. In one exemplary embodiment, one of the optical metrology tools in the fleet can be selected as a reference tool. The measured diffraction signal measured using the reference tool can then be selected as the reference diffraction signal. In another exemplary embodiment, the reference diffraction signal can be obtained by averaging the measured diffraction signals obtained in step 502.

In step 506, a plurality of transforms is generated based on the plurality of measured diffraction signals obtained in step 502 and the reference diffraction signal obtained in step 504. For example, with reference to FIG. 4, a first transform can be generated based on the first set of measured diffraction signals, which was measured using first optical metrology tool 402, and the reference diffraction signal. A second transform can be generated based on the second set of measured diffraction signals, which was measured using second optical metrology tool 404, and the reference diffraction signal.

With reference again to FIG. 5, in step 508, a plurality of measured diffraction signals is obtained. Similar to the measured diffraction signals obtained in step 502, the measured diffraction signals obtained in step 508 were measured using the optical metrology tools in the fleet. For example, with reference again to FIG. 4, a first measured diffraction signal, which was measured using first optical metrology tool 402, can be obtained. A second measured diffraction signal, which was measured using second optical metrology tool 404, can be obtained.

It should be recognized that the first measured diffraction signal can be one of the measured diffraction signals in the first set of measured diffraction signals, and the second measured diffraction signal can be one of the measured diffraction signals in the second set of measured diffraction signals. Alternatively, the first measured diffraction signal can be different than the measured diffraction signals in the first set of measured diffraction signals, and the second measured diffraction signal can be different than the measured diffraction signals in the second set of measured diffraction signals.

With reference again to FIG. 5, in step 510, the plurality of measured diffraction signals obtained in step 508 is transformed into a plurality of transformed diffraction signals using the plurality of transforms generated in step 506. For example, with reference again to FIG. 4, the first measured diffraction signal, which was measured using first optical metrology tool 402, can be transformed into a first transformed diffraction signal using the first transform. The second measured diffraction signal, which was measured using second optical metrology tool 404, can be transformed into a second transformed diffraction signal using the second transform.

Best matching hypothetical profiles of the first and second transformed diffraction signals can be determined using a library-based process or a regression-based process. If the first and second measured diffraction signals were measured from the same structure, the best matching hypothetical profiles of the first and second transformed diffraction signals should be the same, or the difference between the best matching hypothetical profiles should be reduced.

Figure 6:
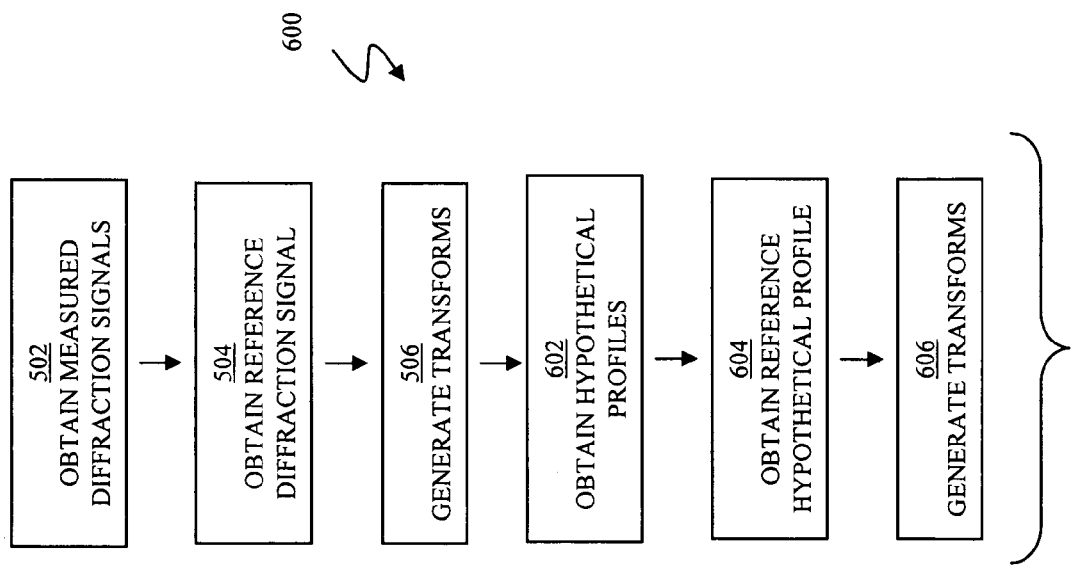
FIG. 6 depicts another exemplary process of matching optical metrology tools.

With reference to FIG. 6, an exemplary process 600 is depicted of matching optical metrology tools in a fleet of optical metrology tools using transforms of measured diffraction signals and transforms of hypothetical profiles. Steps 502-506 of exemplary process 600 are the same as steps 502-506 of exemplary process 500 (FIG. 5). Thus, the following description begins with step 602 of exemplary process 600.

In step 602, a plurality of hypothetical profiles is obtained. In one exemplary embodiment, the plurality measured diffraction signals obtained in step 602 are transformed into a plurality of transformed diffraction signals using the plurality of transforms generated in step 506. The plurality of hypothetical profiles obtained in step 602 can be obtained from this plurality of transformed diffraction signals. Alternatively, a new plurality of measured diffraction signals can be obtained using the optical metrology tools in the fleet. The new plurality of measured diffraction signals are transformed into a plurality of transformed diffraction signals using the plurality of transforms generated in step 506. The plurality of hypothetical profiles obtained in step 602 can be obtained from this plurality of transformed diffraction signals. The plurality of hypothetical profiles obtained in step 602 can be obtained from the transformed diffraction signals using a library-based process or a regression-based process.

In step 604, a reference profile is obtained. In one exemplary embodiment, one of the optical metrology tools in the fleet can be selected as a reference tool. The hypothetical profile obtained from the reference tool can then be selected as the reference profile. In another exemplary embodiment, the reference profile can be obtained from measurements by a metrology tool that is not an optical metrology tool, such as CDs measured using a CD-scanning electron microscopy. In another exemplary embodiment, the reference profile can be obtained by averaging the hypothetical profiles obtained in step 604. In still another exemplary embodiment, the reference profile can be determined based on the reference diffraction signal obtained in step 504.

In step 606, a plurality of transforms is generated based on the plurality of hypothetical profiles obtained in step 602 and the reference profile obtained in step 304. Similar to the transforms generated in step 306 of exemplary process 300 (FIG. 3), each one of the plurality of transforms generated in step 606 are associated with a particular optical metrology tool. For example, a first transform can be associated with first optical metrology tool 402, and a second transform can be associated with second optical metrology tool 404.

After transforms are generated in steps 506 and 606, subsequently obtained measured diffraction signals are transformed using the transforms generated in step 506. Hypothetical profiles are determined for the transformed diffraction signals. The hypothetical profiles are then transformed using the transforms generated in step 606.

For example, with reference again to FIG. 4, assume a subsequent measured diffraction signal is measured using first optical metrology tool 402. The subsequent measured diffraction signal is transformed using one of the transforms generated in step 506, which is associated with first optical metrology tool 402. A hypothetical profile is determined for the transformed diffraction signal. The hypothetical profile is then transformed using one of the transforms generated in step 606, which is associated with first optical metrology tool 402.

The following examples provide more details on the transforms generated in the exemplary processes described above. In the following examples, the optical metrology tools are assumed to be normal-incidence reflectometers that detect intensities reflected from a predetermined target on a wafer as a function of wavelength. Calibration of intensities yield reflectivities (R) as a function of wavelengths (w), tool (t), and sample (s): R(w,t,s)). It should be recognized however that reflectivities (R) can be replaced with any other measurement parameter (e.g., transmittance, ellipsometric parameters), and wavelengths (w) can be replaced with angle of incidence. The structure on the wafer is assumed to be repeating features, with at least one critical lateral dimension "CD" and at least one thickness "T". The measured parameters (P): P(x,t,s) are vectors, x, that vary from tool to tool and from sample to sample. In a simple case, x=[CD T]', where "'" indicates the transpose operation.

In one example of performing process 500 (FIG. 5), the sample position $s_1$ can be an instance of the pattern manufactured on a training set of wafers in different positions on the semiconductor wafer for a particular application $a_1$. An application as described herein represents formation of a specific structure on a semiconductor wafer to be measured. In a preferred embodiment, the reference diffraction signal can be represented by matrix $R_g(w_n,s_1)=<R(w_n,t_j,s_1)>_t$, where $<\bullet>_t$ signifies the average of each component of the matrices $R(w_n,t_j,s_1)$ over all the tools t. The transform for a tool $t_j$ and application $a_1$ on a set of sample positions $s_1$ is represented by the matrix $T(w_n,t_j,a_1)=R_g(w_n,s_1)*R'_A(w_n,t_j,s_1)*[R_A(w_n,t_j,s_1)*R'_A(w_n,t_j,s_1)]^{-1}$ at each wavelength $w_n$, where "*" is matrix multiplication, and "$^{-1}$" represents matrix inversion.

For all the matrices described above the rows are numbered by the first non-unitary index (e.g., "w") and the columns are numbered by the next non-unitary index (e.g., "$s_1$"), and the subscript "A" indicates that the bottom of the matrix has been augmented by a column of ones. In this case, the transformed reflectance at a wavelength $w_n$ becomes the matrix $R_T(w_n,t_j,s_1)=T(w_n,t_j,a_1)*R_{Aj}(w_n,t_j,s_1)$, where the subscript "T" indicates that the reflectance has been transformed.

Transforms derived from augmented matrices are full linear transforms, with a slope and offset. For transforms of measured diffraction signals, however, simpler transforms can be used, such as "shift" transforms "Y" and "scale" transforms "V". The shift transform can be calculated as $Y(w_n,t_j,a_1)=<R_g(w_n,s_1)>_s-<R(w_n,t_j,s_1)>_s$, where $<\bullet>_s$ signifies the average of the reflectance at each wavelength over all the samples, e.g., fields on the training set of wafers. The shift transform is applied simply as $R_T(w_n,t_j,s_1)=Y(w_n,t_j,a_1)+R(w_n,t_j,s_1)$. The scale transform is similarly calculated as $V(w_n,t_j,a_1)=<R_g(w_n,s_1)>_s/<R(w_n,t_j,s_1)>_s$ and applied as $R_T(w_n,t_j,s_1)=V(w_n,t_j,a_1)*R(w_n,t_j,s_1)$. Both the scale and shift transforms are computed and applied wavelength by wavelength. It should be recognized that some other independent variable of the metrology may replace wavelength, e.g., angle of incidence and reflectance, etc. Thus, transforms Y and V are not matrices in the normal sense. Instead, they can be treated as simple scalars.

Any further processing of data from tool $t_j$ on a set of samples uses $R_T(w_n,t_j,s_1)$. For example, this could be the application of a library-based process for determining the features of the measured structures, as described above, and which yields profile information for the application $a_1$ of the set of samples $P(x,t_j,s_1)=L(w,a_1)\{R_T(w_n,t_j,s)\}$, where L represents the application of a library based process. The transforms for each $t_j$ and $a_1$ (for the full range of wavelengths) is stored for ongoing use when any tool $t_j$ in the fleet measures a sample position in $s_1$, of the application $a_1$, during the manufacturing process.

In one example of performing process 300 (FIG. 3), the same set of tools measures the same set of samples for a given application except that the signals obtained by the optical metrology tools are processed to yield a set of hypothetical profiles $P(x,t_j,s_1)$ for each tool $t_j$ and for sample positions $s_1$. In this embodiment, the reference profile parameters are represented by the matrix $P_g(x,s_1)=<P(x,t_j,s_1)>_t$. The transform for some tool $t_j$ and application $a_1$ is $U(x,t_j,a_1)=P_g(x,s_1)*P'_A(x,t_j,s_1)*[P_A(x,t_j,s_1)*P'_A(x,t_j,s_1)]^{-1}$. While this is similar to the example of the reflectivity transform T, above, it has several differences. One difference is that for the diffraction signal transform T, the different values of the wavelength w are treated individually. So there are independent transforms at each wavelength.

For the current example of a parameter transform, all of the values of the first independent variable x are treated simultaneously. "A" again indicates that the bottom of the matrix has been augmented by a column of ones. So transform U has members that can be identified as offsets, linear scaling and cross-parameter correlations. In this case, the transformed parameters become $P_U(x,t_j,s_1)=U(x,t_j,a_1)*P_A(x,t_j,s_1)$, where the subscript "U" indicates that the parameters have been transformed. The parameter transforms for each tool and application can be stored for ongoing use when any tool in t measures a sample position in $s_1$ made by application $a_1$ during the manufacturing process.

A numerical example of process 300 (FIG. 3) is described below. In the following example, $A(p,s_1)$ is a matrix of the reference profile parameters values obtained by taking the mean of profile parameter values for two different tools. Columns s=1:ns represent sample positions on the semiconductor wafer. Rows p=1:np represent the set of hypothetical profile parameters value for this application. The samples all come from different exposure fields on a single wafer. The parameters are top critical dimension (TCD), bottom critical dimension (BCD), oxide thickness (Oxide) and over-etch depth into the Si (Si). The values are in units of nanometers (nm). $A(p_i,s_i)$ is given by the following matrix:

| | Field row | | | | | | | | |
|---|---|---|---|---|---|---|---|---|---|
| | 0 | 5 | 0 | −5 | 0 | 5 | 5 | −5 | −5 |
| | Field col | | | | | | | | |
| | 0 | 0 | 5 | 0 | −5 | −5 | 5 | 5 | −5 |
| TCD | 189.3 | 198.2 | 194.2 | 193.8 | 191.9 | 198.2 | 198.7 | 196.5 | 194.7 |
| BCD | 194.6 | 204.3 | 199.6 | 198.7 | 197.5 | 205.9 | 205.1 | 202.8 | 203.3 |
| Oxide | 343.3 | 351.4 | 344.2 | 345.1 | 337.6 | 342.5 | 345.4 | 344.3 | 326.7 |
| Si | 10.9 | 11.1 | 12.3 | 12.2 | 12.9 | 12.6 | 12.7 | 12.9 | 12.9 |

B(p,s) is a matrix, depicted below, of a tool's measured parameters, where s and p have identical meanings as in A:

| | Field row | | | | | | | | |
|---|---|---|---|---|---|---|---|---|---|
| | 0 | 5 | 0 | −5 | 0 | 5 | 5 | −5 | −5 |
| | Field col | | | | | | | | |
| | 0 | 0 | 5 | 0 | −5 | −5 | 5 | 5 | −5 |
| TCD | 187.9 | 196.7 | 192.8 | 192.8 | 190.2 | 196.4 | 196.8 | 194.7 | 192.6 |
| BCD | 193.4 | 203.7 | 198.9 | 197.8 | 196.8 | 205.3 | 204.5 | 202.1 | 203 |
| Oxide | 343.6 | 351.4 | 344.3 | 345 | 337.8 | 342.5 | 345.6 | 344.4 | 326.7 |
| Si | 11.3 | 11.2 | 12.4 | 12.2 | 13.1 | 12.6 | 12.8 | 12.9 | 12.9 |

As can be seen from above, the values in A and B are different. $B_A(p_A,s)=[B(p,s); ones(1,ns)]$ is the augmented version of B with an extra row of ones. $U=A*B_A'*inv(B_A*B_A')$ is the unit-less transform used to make measurements from this tool agree with the source of the reference profile. U is given by:

| | TCD | BCD | Oxide | Si | Ones |
|---|---|---|---|---|---|
| TCD | 0.55 | 0.35 | 0.05 | 0.27 | −3.54 |
| BCD | −0.08 | 1.01 | 0.03 | 0.05 | 2.94 |
| Oxide | 0.2 | −0.12 | 0.96 | −0.05 | −1.65 |
| Si | 0.16 | −0.09 | −0.03 | 1.01 | −3.71 |

The rows and columns are attached to the various parameters to be measured, with the last column (Ones) resulting from the augmentation of B with a row of ones. The column associated with ones is offset for the transform. The diagonal values of U are the transform gains for each parameter, and the off-diagonals are cross-parameter correlation terms.

The transformed training set is $B_u=U*B_A$. $B_u$ is not an augmented set, because of the way that U is defined. $B_u$ is given by:

| | Field row | | | | | | | | |
|---|---|---|---|---|---|---|---|---|---|
| | 0 | 5 | 0 | −5 | 0 | 5 | 5 | −5 | −5 |
| | Field col | | | | | | | | |
| | 0 | 0 | 5 | 0 | −5 | −5 | 5 | 5 | −5 |
| TCD | 189.3 | 198.1 | 194.3 | 193.8 | 191.9 | 198.4 | 198.6 | 196.5 | 194.7 |
| BCD | 194.5 | 204.5 | 199.8 | 198.6 | 197.6 | 205.8 | 205.1 | 202.8 | 203.3 |
| Oxide | 343.4 | 351.4 | 344.2 | 345 | 337.6 | 342.4 | 345.6 | 344.3 | 326.7 |
| Si | 10.9 | 11.1 | 12.3 | 12.2 | 12.9 | 12.5 | 12.8 | 12.8 | 12.9 |

As can be seem from above, $B_u$ is much closer to A than B, demonstrating that the transform improves matching between these two tools for this application. The match between $B_u$ and A is not exact but is a best match in a least squares sense. The root-mean-square (RMS) average differences from reference profile parameters A are 0.92 for the original B and 0.082 for the transformed $B_u$.

As ones skilled in the art will appreciate, the reference diffraction signals and/or reference profiles can be obtained in various ways. The reference diffraction signals and reference profiles, discussed above, were calculated as means across a plurality of tools. For a small number of tools, medians might be preferable, or any other statistical measure. For example, if the fleet includes a small number of optical metrology tools, medians may be preferable over means. However, if the fleet includes a large number of optical metrology tools, means may be preferable over medians. Alternatively, one of the tools might be designated as a reference tool, and its results used as the reference results. Alternatively, the reference results may derive from measurements made by completely different tools which are not part of the manufacturing fleet. For example, the CDs above could come from a CD-SEM.

As ones skilled in the art will appreciate, the mathematical approaches to deriving and applying the transforms are exemplary only, and other approaches may be used. Several of the exemplary transforms above are linear transforms that are optimal in a least-squares sense. While they were derived with the well know pseudo inverse of matrices, other approaches are possible. Higher-order methods, such as polynomial transforms are possible, especially with larger training sets. Various matrix decomposition methods can be used to reduce the sensitivity, for example, to noise in the data, e.g., principle-component analysis. Other methods can be used to increase the computational efficiency, for example, neural networks.

Additionally, the examples provided above described reflectivities as a function of wavelength. As noted above, it should be recognized, however, that other independent variables (e.g., angle of incidence) and other dependent variables (e.g., transmittance, ellipsometric parameters) can be used.

Although exemplary embodiments have been described, various modifications can be made without departing from the spirit and/or scope of the present invention. Therefore, the present invention should not be construed as being limited to the specific forms shown in the drawings and described above.

We claim:

1. A method of generating transforms for matching optical metrology tools in a fleet of optical metrology tools, the method comprising:
   a) obtaining a first set of measured diffraction signals, wherein the first set of measured diffraction signals was measured using a first optical metrology tool from the fleet of optical metrology tools;

b) obtaining a second set of measured diffraction signals, wherein the second set of diffraction signals was measured using a second optical metrology tool from the fleet of optical metrology tools;

c) obtaining a reference diffraction signal;

d) generating a first transform based on the first set of measured diffraction signals and the reference diffraction signal; and e) generating a second transform based on the second set of measured diffraction signals and the reference diffraction signal.

2. The method of claim 1, wherein the first and second transforms are linear transforms.

3. The method of claim 1, wherein the reference diffraction signal is obtained by averaging the first and second sets of measured diffraction signals.

4. The method of claim 1, wherein the reference diffraction signal is obtained by selecting a measured diffraction signal measured using one of the optical metrology tools in the fleet of optical metrology tools.

5. The method of claim 1, wherein the first transform is associated with an application, and wherein the second transform is associated with the application, wherein the application defines one or more fabrication processes and process parameters.

6. The method of claim 1, further comprising:
storing the first and second transforms, wherein an association of the first transform to the first optical metrology tool is stored with the first transform, and wherein an association of the second transform to the second optical metrology tool is stored with the second transform.

7. The method of claim 6, further comprising:
obtaining a first measured diffraction signal, wherein the first measured diffraction signal was measured using the first optical metrology tool;
obtaining a second measured diffraction signal, wherein the second measured diffraction signal was measured using the second optical metrology tool;
retrieving the first transform based on the association of the first transform to the first optical metrology tool;
retrieving the second transform based on the association of the second transform to the second optical metrology tool;
transforming the first measured diffraction signal into a first transformed diffraction signal using the first transform; and
transforming the second measured diffraction signal into a second transformed diffraction signal using the second transform.

8. The method of claim 7, further comprising:
determining a first hypothetical profile using the first transformed diffraction signal; and
determining a second hypothetical profile using the second transformed diffraction signal.

9. The method of claim 1, further comprising:
obtaining a first set of hypothetical profiles;
obtaining a second set of hypothetical profiles;
obtaining a reference profile;
generating a third transform based on the first set of hypothetical profiles and the reference profile; and
generating a fourth transform based on the second set of hypothetical profiles and the reference profile.

10. The method of claim 9, further comprising:
transforming the first set of measured diffraction signals into a first set of transformed diffraction signals using the first transform, wherein the first set of hypothetical profiles is obtained based on the first set of transformed diffraction signals; and
transforming the second set of measured diffraction signals into a second set of transformed diffraction signals using the second transform, wherein the second set of hypothetical profiles is obtained based on the second set of transformed diffraction signals.

11. The method of claim 9, further comprising:
obtaining a third set of measured diffraction signals, wherein the third set of measured diffraction signals was measured using the first optical metrology tool;
obtaining a fourth set of measured diffraction signals, wherein the fourth set of diffraction signals was measured using the second optical metrology tool;
transforming the third set of measured diffraction signals into a first set of transformed diffraction signals using the first transform, wherein the first set of hypothetical profiles is obtained based on the first set of transformed diffraction signals; and
transforming the fourth set of measured diffraction signals into a second set of transformed diffraction signals using the second transform, wherein the second set of hypothetical profiles is obtained based on the second set of transformed diffraction signals.

12. The method of claim 9, wherein the reference profile is obtained based on the reference diffraction signal.

13. The method of claim 9, further comprising:
obtaining a first measured diffraction signal measured by the first optical metrology tool;
obtaining a second measured diffraction signal measured by the second optical metrology tool;
transforming the first measured diffraction signal into a first transformed diffraction signal using the first transform;
transforming the second measured diffraction signal into a second transformed diffraction signal using the second transform;
obtaining a first hypothetical profile based on the first transformed diffraction signal;
obtaining a second hypothetical profile based on the second transformed diffraction signal;
transforming the first hypothetical profile into a first transformed hypothetical profile using the third transform; and
transforming the second hypothetical profile into a second transformed hypothetical profile using the fourth transform.

14. A method of matching optical metrology tools in a fleet of optical metrology tools using transforms, the method comprising:

a) obtaining a first measured diffraction signal, wherein the first measured diffraction signal was measured using a first optical metrology tool from the fleet of optical metrology tools;

b) obtaining a second measured diffraction signal, wherein the second measured diffraction signal was measured using a second optical metrology tool from the fleet of optical metrology tools;

c) obtaining a first transform associated with the first optical metrology tool;

d) obtaining a second transform associated with the second optical metrology tool;

e) transforming the first measured diffraction signal into a first transformed diffraction signal using the first transform; and f) transforming the second measured diffraction signal into a second transformed diffraction signal using the second transform.

15. The method of claim 14, wherein the first and second transforms are obtained from a computer-readable medium.

16. The method of claim 14, wherein the first and second transforms are linear transforms.

17. The method of claim 14, wherein the first transform is associated with an application, and wherein the second transform is associated with the application, wherein the application defines one or more fabrication processes and process parameters.

18. The method of claim 14, further comprising:
obtaining a first hypothetical profile using the first transformed diffraction signal;
obtaining a second hypothetical profile using the second transformed diffraction signal;
obtaining a third transform associated with the first optical metrology tool;
obtaining a fourth transform associated with the second optical metrology tool;
transforming the first hypothetical profile into a first transformed hypothetical profile using the third transform; and
transforming the second hypothetical profile into a second transformed hypothetical profile using the fourth transform.

19. A system to match optical metrology tools in a fleet of optical metrology tools using transforms, the system comprising:
a first optical metrology tool, wherein a first set of measured diffraction signals is measured using the first optical metrology tool;
a second optical metrology tool, wherein a second set of measured diffraction signals is measured using the second optical metrology tool; and
a processing module configured to:
a) obtain the first set of measured diffraction signals measured using the first optical metrology tool;
b) obtain the second set of measured diffraction signals measured using the second optical metrology tool;
c) obtain a reference diffraction signal;
d) generate a first transform based on the first set of measured diffraction signals and the reference diffraction signal; and
e) generate a second transform based on the second set of measured diffraction signals and the reference diffraction signal.

20. The system of claim 19, wherein the processor is further configured to:
obtain a first set of hypothetical profiles;
obtain a second set of hypothetical profiles;
obtain a reference profile;
generate a third transform based on the first set of hypothetical profiles and the reference profile; and
generate a fourth transform based on the second set of hypothetical profiles and the reference profile.

21. The system of claim 20, wherein the processor is further configured to:
obtain a first measured diffraction signal measured by the first optical metrology tool;
obtain a second measured diffraction signal measured by the second optical metrology tool;
transform the first measured diffraction signal into a first transformed diffraction signal using the first transform;
transform the second measured diffraction signal into a second transformed diffraction signal using the second transform;
obtain a first hypothetical profile based on the first transformed diffraction signal;
obtain a second hypothetical profile based on the second transformed diffraction signal;
transform the first hypothetical profile into a first transformed hypothetical profile using the third transform; and transform the second hypothetical profile into a second transformed hypothetical profile using the fourth transform.

22. A computer-readable medium containing computer-executable instructions to match optical metrology tools in a fleet of optical metrology tools using transforms, comprising instructions for:
a) obtaining a first set of measured diffraction signals, wherein the first set of measured diffraction signals was measured using a first optical metrology tool from the fleet of optical metrology tools;
b) obtaining a second set of measured diffraction signals, wherein the second set of measured diffraction signals was measured using a second optical metrology tool from the fleet of optical metrology tools;
c) obtaining a reference diffraction signal;
d) generating a first transform based on the first set of measured diffraction signals and the reference diffraction signal;
e) generating a second transform based on the second set of measured diffraction signals and the reference diffraction signal;

23. The computer-readable medium of claim 22, further comprising instructions for:
obtaining a first measured diffraction signal, wherein the first measured diffraction signal was measured using the first optical metrology tool;
obtaining a second measured diffraction signal, wherein the second measured diffraction signal was measured using the second optical metrology tool;
transforming the first measured diffraction signal into a first transformed diffraction signal using the first transform; and
transforming the second measured diffraction signal into a second transformed diffraction signal using the second transform.

24. The computer-readable medium of claim 22, further comprising instructions for:
obtaining a first set of hypothetical profiles;
obtaining a second set of hypothetical profiles;
obtaining a reference profile;
generating a third transform based on the first set of hypothetical profiles and the reference profile; and
generating a fourth transform based on the second set of hypothetical profiles and the reference profile.

25. The computer-readable medium of claim 24, further comprising instructions for:
obtaining a first measured diffraction signal measured by the first optical metrology tool;
obtaining a second measured diffraction signal measured by the second optical metrology tool;
transforming the first measured diffraction signal into a first transformed diffraction signal using the first transform;
transforming the second measured diffraction signal into a second transformed diffraction signal using the second transform;
obtaining a first hypothetical profile based on the first transformed diffraction signal;
obtaining a second hypothetical profile based on the second transformed diffraction signal;
transforming the first hypothetical profile into a first transformed hypothetical profile using the third transform; and
transforming the second hypothetical profile into a second transformed hypothetical profile using the fourth transform.

* * * * *